United States Patent [19]

Choi

[11] Patent Number: 5,015,891

[45] Date of Patent: May 14, 1991

[54] OUTPUT FEEDBACK CONTROL CIRCUIT FOR INTEGRATED CIRCUIT DEVICE

[75] Inventor: Yun-ho Choi, Incheon, Rep. of Korea

[73] Assignee: SamSung Electronics Co., Ltd., Suweon, Rep. of Korea

[21] Appl. No.: 407,756

[22] Filed: Sep. 15, 1989

[30] Foreign Application Priority Data

Dec. 30, 1988 [KR] Rep. of Korea .................. 88-17888

[51] Int. Cl.$^5$ .................. H03K 3/356; H03K 3/013; H03K 17/16; G11C 7/00

[52] U.S. Cl. .................. 307/530; 307/279; 307/469; 365/205; 365/206

[58] Field of Search .............. 307/443, 465, 469, 468, 307/279; 365/205, 206, 207

[56] References Cited

U.S. PATENT DOCUMENTS

| | | | |
|---|---|---|---|
| 4,233,675 | 11/1980 | Karp et al. | 307/530 X |
| 4,546,455 | 10/1985 | Iwahashi et al. | 307/279 X |
| 4,584,493 | 4/1986 | Lee | 307/279 X |
| 4,701,644 | 10/1987 | Campione | 307/530 |
| 4,808,857 | 2/1989 | Naito et al. | 307/530 |
| 4,931,675 | 6/1990 | Iwata | 307/530 |

OTHER PUBLICATIONS

Stein et al., "Storage Array and Sense/Refresh Circuit for Single Transistor Memory Cells", SC-7, No. 5, pp. 336-340.

*Primary Examiner*—Stanley D. Miller
*Assistant Examiner*—Yen Nguyen
*Attorney, Agent, or Firm*—Robert E. Bushnell

[57] ABSTRACT

An output feedback control circuit for an integrated circuit (IC) device is disclosed which includes an I/O line sense amplifier for amplifying the weak signals read out from cells, a read driver for amplifying the output of the I/O line sense amplifier, an output latch/transmission block for latching or transmitting the output signals of the read driver, a precharge block for precharging the output node of the output latch/transmission block, and a state transition detecting block for generating feedback control clocks. If the circuit of the present invention is installed to the output terminal of an IC decive, the data latched at the output node can be maintained regardless of the intruding of an external noise until a precharge clock is generated at a new cycle. Further, the sense amplifier and the read driver are disabled after having amplified the input signals within a single cycle, and therefore, the DC power consumption can be prevented.

23 Claims, 2 Drawing Sheets

OUTPUT FEEDBACK CONTROL CIRCUIT FOR INTEGRATED CIRCUIT DEVICE

FIELD OF THE INVENTION

The present invention relates to an output feedback control circuit for an integrated circuit device, and particularly to a circuit for feedback controlling the operation of the output stage of an integrated circuit (to be called hereinafter "IC device") in accordance with the final output states of the IC device in order to prevent the supplying of error signals to other external device, in the case weak signals outputted from the unit cells of a high density IC device erroneously generate a state transition due to external noise.

BACKGROUND OF THE INVENTION

In the semiconductor manufacturing fields, the motive for developing high density semiconductor devices, i.e.. ICs of over the VLSI scale lies in the fact that the price per IC unit can be lowered by increasing the chip density. In this connection, the structure of transistors and the design of cells have been developed to reduce the occupied area for a basic cell.

For example, in designing the cells of RAM (random access memory) in which writing and reading of data are possible, the structure of the cell has been advanced from a dynamic 4-transistor cell derived from a flip-flop circuit, via a 3-transistor cell sharing the feedback paths between cells, to a 1-transistor cell consisting of a single MOS transistor and a single capacitor for storing charges.

However, in the process of increasing the density by reducing the occupied area of the basic cell or by simplifying the structure for the basic cell which constitutes a certain function block, various problems have been produced due to the very simplicity of the structure. For example, in the case of a RAM consisting of 1-transistor cells, the gate capacitance itself is not enough for the storage capacitor.

For this reason, there is the hazard that the stored data can be damaged when reading out the data, and further, a highly sensitive amplifier is needed because of extreme weakness of the output voltage (Refer to "Storage Array and Sense/Refresh Circuit for Single Transistor Memory Cells" by Stein, K.U. et al., IEEE Journal of Solid State Circuits, SC-7, No. 5, pp. 336–40).

However, even if an amplifier capable of amplifying the extreme weak voltage with a high amplifying ratio is provided, and further if the amplifier consists of a static amplifier, when an external noise intrudes upon the output of the cell, then the static amplifier will amplify the deformed cell output including the external noise, with the result that undesirable signals will be continuously outputted.

SUMMARY OF THE INVENTION

Therefore, it is an object of the present invention to provide an output feedback control circuit for an IC device, in which the data outputted from a certain function block is prevented from causing a state transition due to an external noise, by latching the data from the cell in advance to block off the data flow, and by disabling the data sense amplifier into the data input to a "don't care" state, so that, even if an external noise is supplied to the output signal of a cell, the final output of the block should not be influenced by the noise.

It is another object of the present invention to provide an output feedback control circuit for an IC device, in which, when the output of a final output node causes a state transition through a normal operating procedure, the data sense amplifier is disabled so that the power loss in the data sense amplifier can be avoided.

In achieving the above objects, the circuit according to the present invention has the following features.

The weak signal outputted from a cell is first amplified by an I/O line sense amplifier and a read driver, and is transferred through a data latch/transmission block to a data output buffer, while a state transition detecting block detects any state transition at the output node of the data latch/transmission block, and for example, outputs a clock signal corresponding to a logic "0" in the positive logic. The outputted clock is fed back to block off the data flow at the data latch/transmission block, and at the same time, to disable the I/O line sense amplifier. A precharge block is operated by a precharge clock which activates the data flow chain in a new cycle, and the precharge block precharges the output node of the data latch/transmission block to a certain level. Under this condition, the state transition detecting block shifts again the level of the feedback control clock signal to a logic "1", thereby activating the sense amplifier, the read driver and a data latch block.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENT

Figure 1:
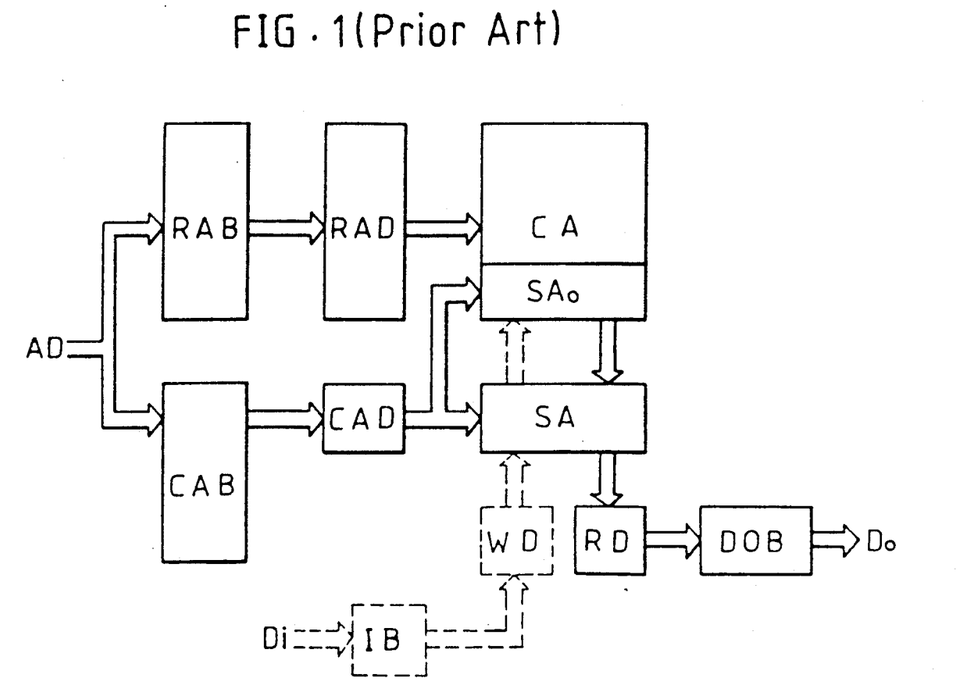
FIG. 1 is a block diagram illustrating the basic constitution of the usual MOS type IC memory device.

FIG. 1 illustrates the basic constitution of a DRAM (dynamic random access memory) which is one of the usual MOS type memory devices. In the drawing, the various control signal lines are not shown for the illustrating convenience. To see into the flow of signals, in synchronization with an external addressing clock, address signals AD are latched onto a row address buffer RAB and a column address buffer CAB, and a word line is selectively driven at a row address decoder RAD, so that the memory cell connected to the above-mentioned word line should be selected within a cell array CA. The data of the selected memory cell is transmitted to a bit line to be amplified by a bit line sense amplifier SAo. Then after receipt of column address signals from the column address buffer CAB, the column address decoder CAD simultaneously selects the bit line sense amplifier SAo and an I/O line sense amplifier SA. The data outputted from the selected bit line sense amplifier SAo is supplied through an I/O data line to the I/O line sense amplifier SA where the data is amplified again, and then, the data is sent through a read driver RD to an output buffer DOB.

In FIG. 1, an input buffer IB, a write driver WD and a bus line represented by phantom lines are for being used in writing a data input Di to a memory cell. It is seen that, if the device for writing data is excluded, then the device of FIG. 1 become substantially the same as the functional elements of a ROM (read only memory).

In the case where the above I/O line sense amplifier SA includes a static sense amplifier, the signal read from a cell is transmitted through the sense amplifier SA, the read driver RD and the output buffer DOB to a data output terminal Do, and therefore, as long as the outputting of data is maintained, the supplying of the input signals to the sense amplifier SA has to be maintained. Under such a condition, if the weak signal which is read from a cell and supplied by the sense amplifier SA is deformed by a noise and the like, the deformed signal will be supplied through a static data flow chain to the data output terminal Do, thereby also changing the data output erroneously. Further, during the driving of the data flow chain, the static sense amplifier will continuously consume the DC power.

Figure 2:
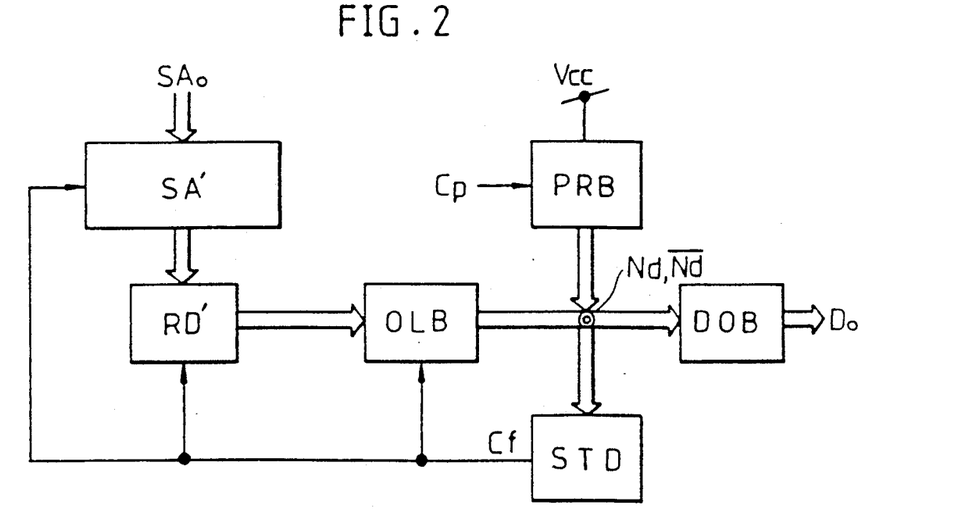
FIG. 2 is a block diagram illustrating the output feedback control circuit for an IC device according to the present invention.

FIG. 2 illustrates an output control circuit which is capable of overcoming the above described disadvantages in an IC device having cells provided with a static sense amplifier at the output stage.

Reference symbols RD' and SA' indicate a read driver and an I/O line sense amplifier having a disable terminal respectively, while OLB indicates an output latch/transmission block for latching or transmitting the output signals of the read driver RD' in synchronization with the feedback control clock. Meanwhile, PRB is a precharge block for precharging the output nodes Nd, $\overline{Nd}$ of the output latch/transmission block OLB to a certain level by way of the power source voltage Vcc in accordance with a precharge clock Cp, and the output terminal of the precharge block PRB is commonly connected to the output nodes of the block OLB.

A state transition detecting block STD detects any state transition occurable at the output nodes Nd, $\overline{Nd}$ of the output latch/transmission block OLB, and generates feedback control Cf clock pulses. The feed-back control clock pulse Cf disables the sense amplifier SA' and the read driver RD', and at the same time, is supplied to the output latch/transmission block OLB to block off the flow of the output data.

Figure 3:
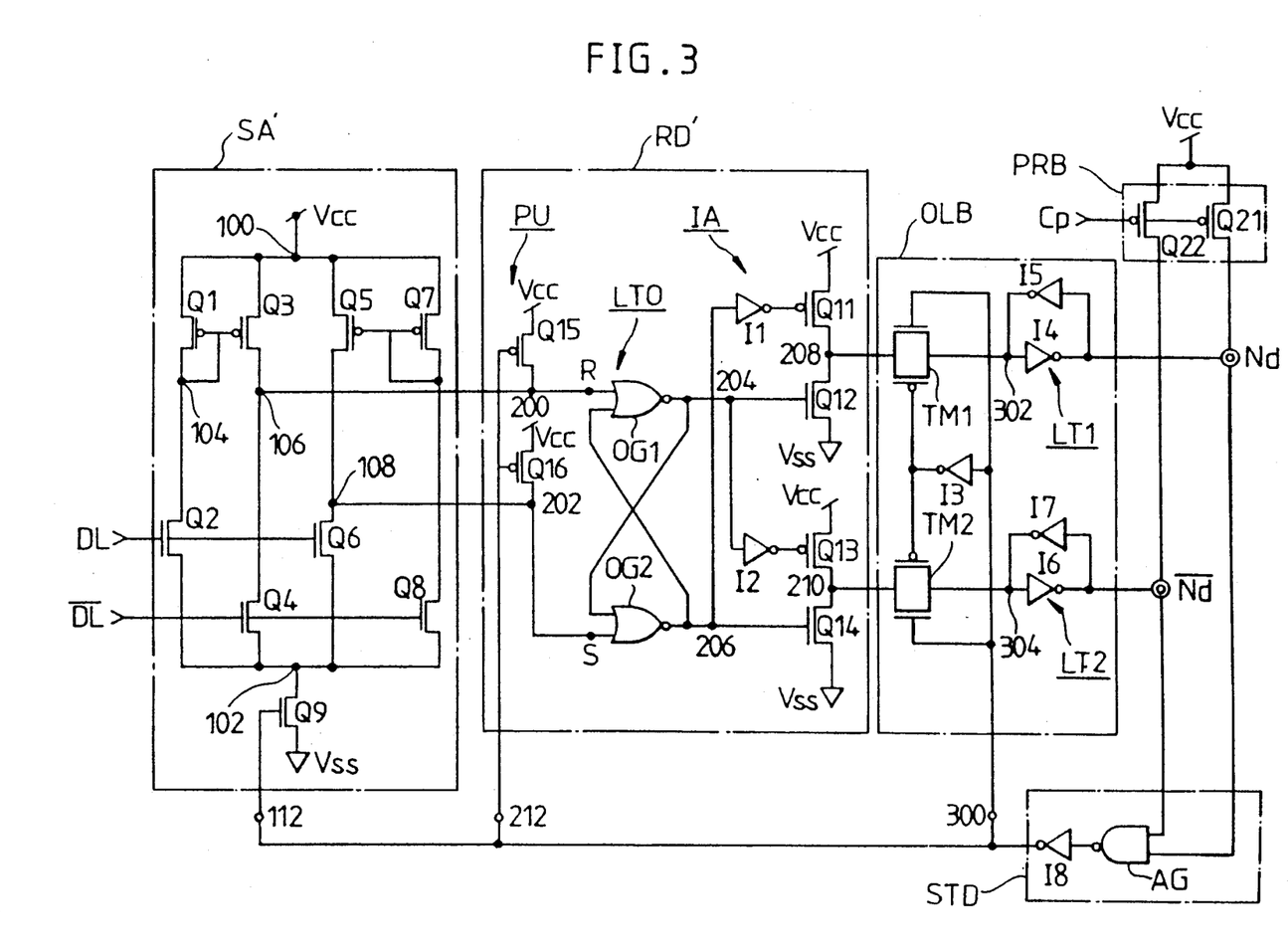
FIG. 3 is a detailed circuital illustration of the block diagram of FIG. 2.

FIG. 3 is detailed illustration of the output feedback control circuit for an IC device of FIG. 2.

The sense amplifier SA' is for amplifying the weak data read out from the cell array CA and transmitted through first and second I/O lines DL, $\overline{DL}$, and is constituted as described below. That is, four pairs of the first conduction type and the second conduction type transistors Q1 and Q2, Q3 and Q4, Q5 and Q6, and Q7 and Q8 are connected in parallel between nodes 100 and 102. The respective transistors of each pair are connected in series. The node 100 constitutes a common connection point for the sources of the first conduction type transistors Q1, Q3, Q5 and Q7, while the node 102 a common connection point for the sources of the second conduction type transistors Q2, Q4, Q6 and Q8.

The gates of the first and third transistors Q1, Q3 are commonly connected to the drain 104 of the first transistor Q1, thereby forming a current mirror. The respective gates of the fifth transistor Q5 and the seventh transistor Q7 are commonly connected to the drain 110 of the seventh transistor Q7, thereby forming another current mirror. The first I/O line DL is connected to the gates of the second and sixth transistors Q2, Q6, while the second I/O line $\overline{DL}$ is connected to the gates of the fourth and eighth transistors Q4, Q8.

A connection node 106 for the drains of the third and fourth transistors Q3, Q4 constitutes a first output terminal of the sense amplifier SA', while a connection node 108 for the drains of the fifth and sixth transistors Q5, Q6 constitutes a second output terminal of the sense amplifier SA', the second output terminal having a complementary relationship to the first output terminal.

As one feature of the present invention, at least a DC power gating transistor is installed between the first source line Vcc and the node 100, or between a second power source line Vss and the node 102. In the embodiment of FIG. 3, as for the DC power gating transistor, the second conduction type transistor Q9 is provided between the node 102 and the second power source line Vss, while a node 112 connected to the gate of the ninth transistor Q9 serve as a disable terminal for receiving control clocks from the state transition detecting block STD.

If the potential of the disable terminal 112 comes to have a high state, the transistor Q9 is turned on so that at least a DC current path could be formed between the first power source line Vcc and the second power source line Vss, and that an enable state of the sense amplifier SA' should be realized. Under this condition, the potentials of the first output terminal 108 and the second output terminal 106 will become same as the potentials of the first I/O line DL and the second I/O line $\overline{DL}$ respectively. On the other hand, if the potential of the disable terminal 112 comes to have a low state, no DC current path will be formed between the first power source line Vcc and the second power source line Vss, and accordingly, the sense amplifier SA' is disabled.

The read driver RD' generally includes three parts; an asynchronous RS latch LTO, an inverting amplifier device IA and a pull-up device PU for the RS latch LTO. The asynchronous RS latch LTO includes two NOR gates OG1 and OG2, of which R input terminal 200 is connected to the first output terminal 106 of the sense amplifier SA', while S input terminal 202 is connected to the second output terminal 108 of the sense amplifier SA'. The inverting amplifier device IA is provided with two inverting/amplifying units for inverting and amplifying the signals of the first and second output terminals 204, 206 of the RS latch LTO.

The first inverting/amplifying unit includes of a first inverter I1 for inverting the signals of the second output terminal 206 of the RS latch LTO; a first conduction type transistor Q11 having a gate connected to the output terminal of the first inverter I1, a source connected to the first power source line Vcc, and a drain connected to the output node 208 of the first inverting/amplifying unit; and a second conduction type transistor Q12 having a gate connected to the first output terminal 204 of the RS latch LTO, a source connected to the second power source line Vss, and a drain connected to the output node 208 of the first inverting/amplifying unit. The output node 208 outputs signals having an inverted relationship to the signals of the first output terminal 204 of the RS latch LTO.

The second inverting/amplifying unit includes a second inverter I2 for inverting the signals of the first output terminal 204 of the RS latch LTO; a first conduction type transistor Q13 having a gate connected to the output terminal of the second inverter I2, a source connected to the first power source line Vcc, and a drain connected to the output node 210 of the second inverting/amplifier unit; and a second conduction type transistor Q14 having a gate connected to the second output terminal 206 of the RS latch LTO, a source connected to second power source line Vss, and a drain connected to the output node 210 of the second inverting/amplifying unit. Meanwhile, the output node 210 outputs signals having an inverted relationship to the signals of the second output terminal 206 of the RS latch LTO.

The pull-up device raises the potential of R, S input terminals of the RS latch LTO to high states, so that the output nodes 208, 210 of the first and second inverting/amplifying unit should be put to "don't care" states. The pull-up device includes first conduction type transistors Q15, Q16, and the respective sources of the transistors Q15, Q16 are connected to the first power source line Vcc, while the respective gates of the transistors Q15, Q16 are commonly connected to the node 212 which receives control clock pulses Cf from the state transition detecting block STD. Further, the drains of the transistors Q15, Q16 are connected respectively to the R input terminal and the S input terminal of the RS latch LTO. Therefore, high signals of the node 212 turn off the transistors Q15, Q16 so that the RS latch LTO can perform the normal latching operations, while low signals of the node 212 turn on the transistors Q15, Q16 to raise the R, S inputs of the RS latch LTO to a high level, with the result that the RS latch LTO is put to a non-allowed state, thereby ultimately making the output node 208 of the first inverting/amplifying unit and the output node 210 of the second inverting/amplifying unit a "don't care" state.

The output latch/transmission block OLB includes a third inverter I3 for inverting the control clock pulses Cf supplied from the state transition detecting block STD; a first transmission gate TM1 having a first (conduction type) gate connected to a node 300 for receiving the control clock pulses Cf, and a second (conduction type) gate connected to the output terminal of the third inverter I3, so as to pass or block the signals of the first output node 208 of the read driver RD' in accordance with the level of the control clock pulse Cf; and a second transmission gate TM2 having a first (conduction type) gate connected to the node 300, and a second (conduction type) gate connected to the output terminal of the third inverter I3, so as to pass or block the signals of the second output node 210 of the read driver RD' in accordance with the level of the control clock Cf.

Moreover, the output latch/transmission block OLB includes a first latch device LT1 and a second latch device LT2, which are for latching the outputs of the first and second transmission gates TM1, TM2 in an inverted state, and for supplying them to the first output node Nd and the second output node $\overline{Nd}$. According to the embodiment of the present invention, the first and second latch device LT1, LT2 each include two inverters I4 and I5 and I6 and I7 connected back-to-back. Therefore, the first output node Nd can maintain inverted signals relative to the signals of the input terminal 302 of the first latch means LT1, while the second output node $\overline{Nd}$ can maintain inverted signals relative to the signals of the input terminal 304 of the second latch device LT2. In effect, if the node 300 receiving the control clock pulse Cf has a high level, the signals from the first and second output nodes 208, 210 of the read driver RD' will pass through the turned-on transmission gates TM1 and TM2, and then will be supplied to the first and second output nodes Nd and $\overline{Nd}$ after being inverted again by the first latch device LT1 and the second latch device LT2.

On the other hand, if the node 300 has a low level, then the transmission gates TM1 and TM2 are all turned off, the outputs of the read driver RD' are all blocked off, and the first and second latch device LT1, LT2 latch the levels of the first output node Nd and the second output node $\overline{Nd}$ in an intact state.

The precharge block PRB includes of a pair of second conduction type transistors Q21, Q22, and sets the first and second output nodes Nd, $\overline{Nd}$ of the output latch/transmission block OLB to the level of the first power source line Vcc each time a precharge clock pulse Cp is supplied at each read cycle. The sources of the transistors Q21, Q22 are commonly connected to the first power source line Vcc, and the drain of the transistor Q21 is connected to the node Nd, while the drain of the transistor Q22 is connected to the node $\overline{Nd}$. And, the gates of these transistors all receive precharge clock pulses Cp. Under such condition, if the clock pulse Cp of a low level is applied, then the transistors Q21, Q22 are all turned on, so that the first and second output nodes Nd, $\overline{Nd}$ of the block OLB should all be set to the Vcc level, that is, to Nd=1, and $\overline{Nd}$=1. On the other hand, if the clock pulse Cp is kept at a high level, then the transistors Q21, Q22 are all turned off, and accordingly, the first and second output nodes Nd, $\overline{Nd}$ of the block OLB are separated from the precharge voltage Vcc, holding the current value continuously.

The state transition detecting block STD detects any state transition occurable at the first and second output nodes Nd, $\overline{Nd}$ of the output latch/transmission block OLB in order to generate feedback control clock pulses Cf and includes a NAND gate AG for inputting the signals of the first and second output nodes Nd, $\overline{Nd}$ of the block OLB, and an inverter I8 for inverting the output of the NAND gate AG.

The overall operations of the circuit according to the present invention constituted as above will now be described.

Under the precharge state, i.e., under Nd=$\overline{Nd}$=1, the state transition detecting block STD generates a control output of a logic "1", i.e., a high state to activate the sense amplifier SA' and the read driver RD', and at the same time, to put the output latch/transmission block OLB to a transmission mode, so that the a signal flow chain should be formed from the first and second I/O lines DL, $\overline{DL}$ coupled with the input terminals of the sense amplifier SA' to the first and second output nodes Nd, $\overline{Nd}$ of the output latch/transmission block OLB.

According to the constitution shown in FIG. 3, the output nodes Nd, $\overline{Nd}$ have data of inverted levels relative to the signals of the first and second I/O lines DL, $\overline{DL}$. In any case, if the output nodes Nd, $\overline{Nd}$ are shifted from a precharge state (Nd=1, $\overline{Nd}$=1) to a logic "0" state (Nd=0, $\overline{Nd}$=1), or to a logic "1" state (Nd=1, $\overline{Nd}$=0) based on the signals of the first and second I/O lines, then the state transition detecting block STD generates a low level clock pulse Cf. The generated clock pulse Cf of a logic "0" level is fed back to the output latch/transmission block OLB to block off the data flow under a state with the current output latched, and at the same time, the clock pulse Cf is delivered to the sense amplifier SA' and the read driver RD' to disable them.

Therefore, even if a weak cell output may be deformed late by an external noise and may be supplied to the sense amplifier SA', the sense amplifier SA' or the read driver RD' can no longer perform the amplifying functions, with the result that the output state of the output nodes Nd, $\overline{Nd}$ is not affected and is supplied through the data output buffer DOB to the output terminal Do.

Then, upon starting of a new cycle, if precharge clock pulse Cp drives the precharge block PRB, then the output nodes Nd, $\overline{Nd}$ are put to a precharge state. Accordingly, the feedback control clock pulse Cf which has been a logic "0" level is shifted to a logic "1" by the state transition detecting block STD, with the result that the sense amplifier SA' and the read driver RD' are reactivated to amplify the newly inputted data, thereby supplying the amplified data through the output latch/transmission block OLB to the output nodes Nd, $\overline{Nd}$.

As described above, if the feedback control circuit of the present invention is installed to the output stage of an IC device, the data latched at the output node can be maintained regardless of the intruding of an external noise until a precharge clock pulse is generated at a new cycle. Further, the sense amplifier and the read driver are disabled after having amplified the input signals within a single cycle, and therefore, the DC power loss can be prevented.

What is claimed is:

1. An output feedback control circuit for an integrated circuit device having an output stage for amplifying first weak signals read from a cell array forming a particular block, comprising:
    a state transition detecting block for generating feedback control clock pulses after detecting any transition of output state in first and second output nodes;
    a state transition detecting block for generating feedback control clock pulses after detecting any transition of output state in first and second output nodes;
    an I/O line sense amplifier for amplifying the first weak signals read from said cell array, and having a first disable terminal for receiving feedback control clock pulses from said state transition detecting block;
    a read driver for amplifying second and third signals received from said I/O line sense amplifier and having a second disable terminal for receiving the feedback control clock pulses from said state transition detecting block;
    an output latch/transmission block for latching or transmitting fourth and fifth signals received from said read driver in accordance with voltage levels of the feedback control clock pulses received from said state transition detecting block; and
    a precharge block for precharging said first and second output nodes of said output latch/transmission block in synchronization with a precharge clock pulse;
    whereby, if said first and second output nodes cause a stage transition under a precharge state, the feedback control clock pulse from said state transition detecting block disables said I/O line sense amplifier and read driver, and latches current signals from said output latch/transmission block to block data flow, while, if the first and second output nodes are restored to the precharge state in synchronization with the precharge clock pulse at a new cycle, when said feedback control clock pulse is put in a reset stage, said I/O line sense amplifier, read driver and latch/transmission block should be activated to form a data input path for newly received data.

2. The output feedback control circuit as claimed in claim 1, wherein said I/O line sense amplifier comprises:
    a plurality of first transistors coupled in four transistor pairs, each transistor pair comprising a first conduction type transistor and a second conduction type transistor, said transistor pairs connected in parallel between a first power source line and a second power source line, the transistors of each pair are connected in series; said first conduction type transistors are coupled to form two current mirrors, gates of a first pair of said second conduction type transistors are connected to a first I/O line, and gates of a second pair of said second conduction type transistors are connected to a second I/O line, a first connection node between drains of said first and second conduction type transistors in a first transistor pair constitute a first output terminal of said sense amplifier, and a second connection node between drains of said first and second conduction type transistors in a second transistor pair constitute a second output terminal of said sense amplifier, a first common connection terminal of sources of said first conduction type transistors are connected to said first power source line, and a second common connection terminal of sources of said second conduction type transistors are connected to said second power source line; and
    a second DC power gating transistor coupled between said first power source line and said first connection node, or between said second power source line and said second connection node, and having a gate connected to a disable terminal for receiving said feedback control clock pulse from said state transition detecting block.

3. The output feedback control circuit as claimed in claim 2, wherein said second transistor is a second conduction type transistor, having a source and drain connected to said second power source line and said second connection node, respectively.

4. The output feedback control circuit as claimed in claim 1, wherein said read driver comprises:
    a RS latch coupled to receive the second and third signals from first and second output nodes, respectively, of said I/O lines sense amplifier;
    inverting amplifier means comprising:
        a first inverting/amplifying unit, comprising:
            a first invertor, for inverting seventh signals received from a second output terminal of said RS latch;
            a third transistor of first conduction type having a gate connected to receive inverted seventh signals from said first invertor, a source connected to said first power source line, and a drain connected to a first output node of said read driver; and
            a fourth transistor of second conduction type having a gate coupled to receive sixth signals from said RS latch, a source connected to said second power source line, and a drain connected to said first output node of said read driver, said first output node delivering the fourth signals relative to the sixth signals of a first output terminal of said RS latch;
        a second inverting/amplifying unit, comprising:

a second invertor for inverting the sixth signals received from said first output terminal of said RS latch;

a fifth transistor of first conduction type having a gate connected to receive inverted sixth signals from said second invertor, a source connected to said first power source line, and a drain connected to a second output node of said read driver; and a sixth transistor of second conduction type having a gate coupled to receive said seventh signals from said second output terminal of said RS latch, a source connected to said second power source line, and a drain connected to said second output node of said read driver, said second output node of said second output terminal of said RS latch; and a pull-up means comprising seventh and eighth first conduction type transistors the sources of said seventh and eighth transistors being connected to said first power source line, the gates of said seventh and eight transistors being commonly connected to a disable terminal receiving control clock pulses from said state transition detecting block, and having drains connected respectively to an R input terminal and to an S input terminal of said RS latch.

5. The output feedback control circuit as claimed in claim 4, wherein a high voltage signal received by said second disable terminal turns off said seventh and eighth transistors of said pull up means allowing said RS latch to perform normal latching operations, and a low voltage signal received by said second disable terminal turns on said seventh and eighth transistors of said pull up means to change the R and S inputs of said RS latch to a high voltage level, with the result that said RS latch is in a non-allowed state, and that said are in a "don't care" state.

6. The output feedback control circuit as claimed in claim 1, wherein said output latch/transmission block comprises:

a third invertor for inverting the control clock pulse supplied from said state transition detecting block;

a first transmission gate having a first gate coupled to receive control clock pulses, and a second gate coupled to receive inverted control clock pulses from said third invertor, and for passing or blocking the fourth signals received from said first output node of said read driver in accordance with the voltage levels of the control clock pulses;

a second transmission gate having a first gate coupled to receive control clock pulses, and a second gate coupled to receive inverted control clock pulses from said third invertor, and for passing or blocking the fifth signals received from said second output node of said read driver in accordance with the voltage levels of the control clock pulses; and a first latching means and a second latching means for respectively latching eighth and ninth signals delivered by said first and second transmission gates in an inverted state, and for supplying the eighth and ninth signals to said first and second output nodes.

7. The output feedback control circuit as claimed in claim 1, wherein said state transition detecting block comprises:

a NAND gate coupled to receive signals from said first and second output nodes of said output latch/transmission block; and an invertor for inverting signals received from said NAND gate, and generating feedback control clock pulses upon detecting any stage transition at said first and second output nodes of said output latch/transmission block.

8. An output feedback control circuit for an integrated circuit device for amplifying first weak signals read from a cell array, comprising:

a state transition detecting block;

an I/O line sense amplifier coupled to receive the first weak signals from said cell array and first clock pulses from said state transition detecting block;

a read driver coupled to receive second and third signals from said I/O line sense amplifier and first clock pulses from said state transition detecting block;

an output latch/transmission block coupled to receive fourth and fifth signals from said read driver based upon voltage levels of the first clock pulses received from said state transition detecting block; and a precharge block coupled to deliver a precharge voltage to first and second output nodes of said output latch/transmission block based upon second clock pulses.

9. The output feedback control circuit as claimed in claim 8, wherein said I/O line sense amplifier comprises:

a plurality of first transistors coupled in four transistor pairs, each of said transistor pairs comprises a first and second conduction type transistor, said transistor pairs connected in parallel forming first and second connection nodes; and a second DC power gating transistor coupled between a first power source line and a first connection node, or between a second power source line and a second connection node.

10. The output feedback control circuit as claimed in claim 9, wherein said transistor pairs of said I/O line sense amplifier are connected in series, said first conduction type transistors of each pair are coupled to form two current mirrors, gates of a first two of said second conduction type transistors are connected to a first I/O line, and gates of a second two of said second conduction type transistors are connected to a second I/O line, a first connection node between drains of said first and second conduction type transistors in a first transistor pair constitute a first output terminal of said sense amplifier, and a second connection node between drains of said first and second conduction type transistors in a second transistor pair constitute a second output terminal of said sense amplifier, a first common connection terminal of sources of said first conduction type transistors are connected to said first power source line, and a second common connection terminal of sources of said second conduction type transistors are connected to said second power source line.

11. The output feedback control circuit as claimed in claim 9, wherein said second transistor is a second conduction type transistor, having a source and drain connected to said second power source line and said second connection node, respectively, and a gate connected to a first disable terminal for receiving said first clock pulse from said state transition detecting block.

12. The output feedback control circuit as claimed in claim 8, wherein said read driver comprises:

a RS latch coupled to receive signals from first and second output terminals of said I/O line sense amplifier;

inverting amplifier means for inverting and amplifying signals received from said RS latch; and a pull-up means comprising a plurality of third transistors each having a source connected to said first power source line, a gate connected to a second disable terminal receiving first clock pulses from said state transition detecting block, and a drain connected to an R input terminal or an S input terminal of said RS latch.

13. The output feedback control circuit as claimed in claim 11, wherein said inverting amplifier means contained in said read driver comprises:

a first inverting/amplifying unit, for inverting/amplifying sixth signals from a first output terminal of said RS latch, comprising:

a first invertor, for inverting the signals received from a second output terminal of said RS latch;

a third transistor of first conduction type having a gate connected to receive the inverted signals from said first invertor, a source connected to said first power source line, and a drain connected to a first output node of said read driver; and a fourth transistor of second conduction type having a gate coupled to receive signals from a first output terminal of said RS latch, a source connected to said second power source line, and a drain connected to said first output node of said read driver, said first output node delivering inverted signals relative to the signals of said first output terminal of said RS latch, a second inverting/amplifying unit, for inverting/amplifying signals of from said second output terminal of said RS latch, comprising:

a second invertor for inverting the signals received from said first output terminal of said RS latch;

a fifth transistor of first conduction type having a gate connected to receive signals from said second invertor, a source connected to said first power source line, and a drain connected to a second output node of said read driver; and a sixth transistor of second conduction type having a gate coupled to receive signals from said second output terminal of said RS latch, a source connected to said second power source line, and a drain connected to said second output node of said read driver and said second output node outputting inverted signals relative to the signals of said output terminal of said RS latch.

14. The output feedback control circuit as claimed in claim 8, wherein said output latch/transmission block comprises:

a third invertor for inverting the first clock pulse supplied from said state transition detecting block;

a first transmission gate having a first gate coupled to receive the first clock pulses, and a second gate coupled to receive signals from said third invertor, and for passing or blocking the first signals received from said read driver in accordance with the levels of the first clock pulse;

a second transmission gate having a first gate coupled to receive the first clock pulses, and a second gate coupled to receive signals from said third invertor, and for passing or blocking the second signals received from said read driver in accordance with the levels of the first clock pulse; and first and second latching means for latching signals received from said first and second transmission gates in an inverted state, and supplying the signals to said first and second output nodes.

15. The output feedback control circuit as claimed in claim 8, wherein said state transition detecting block comprises a NAND gate coupled to receive signals from said first and second output nodes of said output latch/transmission block, and a fourth invertor for inverting signals received from said NAND gate, and detects any stage transition at said first and second output nodes of said output latch/transmission block to generate the first clock pulses.

16. An integrated circuit device for amplifying first weak signals, comprising:

a row address buffer coupled to receive address signals;

a column address buffer coupled to receive address signals;

a row address decoder coupled to receive row address signals from said row address buffer;

a column address decoder coupled to receive column address signals from said column address buffer;

a cell array coupled to receive signals from said row address decoder for selecting a memory cell within said cell array;

a bit line sense amplifier coupled to receive data read from the selected memory cell of said cell array and selection signals from said column address decoder and to amplify the data read from the selected memory cell of said cell array;

a state transition detecting block, coupled to receive selection signals from said column address decoder, for generating feedback control clock pulses after detecting any transition of output state in first and second output nodes;

an I/O line sense amplifier for amplifying the first weak signals read from said cell array, and having a first disable terminal for receiving feedback control clock pulses from said state transition detecting block;

a read driver for amplifying second and third signals received from said I/O line sense amplifier and having a second disable terminal for receiving the feedback control clock pulses from said state transition detecting block;

an output latch/transmission block for latching or transmitting fourth and fifth signals received from said read driver in accordance with voltage levels of the feedback control clock pulses received from said state transition detecting block; and a precharge block for precharging said first and second output nodes of said output latch/transmission block in synchronization with a precharge clock pulse whereby, if said first and second output nodes cause a stage transition under a precharge state, the feedback control clock pulse from said state transition detecting block disables said I/O line sense amplifier and read driver, and latches current signals from said output latch/transmission block to block data flow, while, if the first and second output nodes are restored to the precharge state in synchronization with the precharge clock pulse at a new cycle, when said feedback control clock pulse is put in a reset stage, said I/O line sense amplifier, read driver and latch/transmission block should be activated to form a data input path for newly received data.

17. The output feedback control circuit as claimed in claim 16, wherein said I/O line sense amplifier comprises:
a plurality of first transistors coupled in four transistor pairs, each transistor pair comprising a first conduction type transistor and a second conduction type transistor, said pairs connected in parallel between a first power source line and a second power source line, the transistors of each transistor pair are connected tin series; said first conduction type transistors are coupled to form two current mirrors, gates of first and second conduction type transistors are connected to a first I/O line, and gates of third and fourth second conduction type transistors are connected to a second I/O line, a first connection node between drains of first and second conduction type transistors in a first transistor pair constitute a first output terminal of said sense amplifier, and a second connection node between drains of first and second conduction type transistors in a second transistor pair constitute a second output terminal of said sense amplifier, a first common connection terminal of sources of said first conduction type transistors are connected to said first power source line, and a second common connection terminal of sources of said second conduction type transistors are connected to said second power source line; and
a second DC power gating transistor coupled between said first power source line and said first connection node, or between said second power source line and said second connection node, and having a gate connected to a disable terminal for receiving said feedback control clock pulse from said state transition detecting block.

18. The output feedback control circuit as claimed in claim 17, wherein said second transistor is a first conduction type transistor, having a source and drain connected to said second power source line and said second connection node, respectively.

19. The output feedback control circuit as claimed in claim 16, wherein said read driver comprises:
a RS latch coupled to receive the second and third signals from said first and second output terminals, respectively, of said I/O line sense amplifier;
inverting amplifier means comprising:
a first inverting/amplifying unit for inverting/amplifying sixth signals received from a first output terminal of said RS latch, comprising:
a first invertor, for inverting seventh signals received from a second output terminal of said RS latch;
a third transistor of first conduction type having a gate connected to receive the inverted seventh signals from said first invertor, a source connected to said first power source line, and a drain connected to a first output node of said read driver; and
a fourth transistor of second conduction type having a gate coupled to receive sixth signals from said RS latch, a source connected to said second power source line, and a drain connected to said first output node of said read driver, said first output node delivering the fourth signals relative to the sixth signals of said first output terminal of said RS latch;
a second inverting/amplifying unit, for inverting/amplifying seventh signals of from said second output terminal of said RS latch, comprising:
a second invertor for inverting the sixth signals received from said RS latch;
a fifth transistor of first conduction type having a gate connected to receive inverted sixth signals from said second invertor, a source connected to said first power source line, and a drain connected to a second output node of said read driver; and
a sixth transistor of second conduction type having a gate coupled to receive seventh signals from said RS latch, a source connected to said second power source line, and a drain connected to said second output node of said read driver, said second output node delivering the fifth signals relative to the seventh of said second output terminal of said RS latch; and
a pull-up means comprising seventh and eighth first conduction type transistors the sources of said seventh and eighth transistors being connected to said first power source line, the gates of said seventh and eighth transistors being commonly connected to a disable terminal receiving control clock pulses from said state transition detecting block, and having drains connected respectively to an R input terminal and to an S input terminal of said RS latch.

20. The output feedback control circuit as claimed in claim 19, wherein a high voltage signal received by said second disable terminal turns off said seventh and eighth transistors of said pull up means allowing said RS latch to perform normal latching operations, and a low voltage signal received by said second disable terminal turns on said seventh and eight transistors of said pull up means to change the R and S inputs of said RS latch to a high voltage level, with the result that said RS latch is in a non-allowed state, and that said first and second output nodes of said read driver are in a "don't care" state.

21. The output feedback control circuit as claimed in claim 16, wherein said output latch/transmission block comprises:
a third invertor for inverting the control clock pulse supplied from said state transition detecting block;
a first transmission gate having a first gate coupled to receive control clock pulses, and a second gate coupled to receive inverted control clock pulses from said third invertor, and for passing or blocking the fourth signals received from said read driver in accordance with the voltage levels of the control clock pulses;
a second transmission gate having a first gate coupled to receive control clock pulses, and a second gate coupled to receive inverted control clock pulses from said third invertor, and for passing or blocking the fifth signals received from said read driver in accordance with the voltage levels of the control clock pulses; and
a first latching means and a second latching means for respectively latching eighth and ninth signals delivered by said first and second transmission gates in an inverted state, and for supplying the eighth and ninth signals to said first and second output nodes.

22. The output feedback control circuit as claimed in claim 16, wherein said state transition detecting block comprises:

a NAND gate coupled to receive signals from said first and second output nodes of said output latch/transmission block; and an invertor for inverting signals received from said NAND gate, and generating feedback control clock pulses upon detecting any stage transition at said first and second output nodes of said output latch/transmission block.

23. A method for amplifying weak signals read from a cell array of an integrated circuit device, comprising the steps of:

reading first weak signals from a cell array;

performing a first amplification process on the weak signals read from the cell array producing a second signal;

checking for a transition of output state at output nodes;

generating a clock pulse upon detection of a transition of output state;

performing a second amplification process on the amplified weak signals producing a third signal upon receipt of the clock pulse;

latching or transmitting the third signal based on the voltage level of the clock pulse;

precharging the output nodes in synchronization with a precharge clock;

disabling the first and second amplification processes and latching the third signal upon a transition of state under a precharge state; and enabling the first and second amplification processes and transmitting the third signal upon a transition of state in synchronization with a precharge clock pulse.

* * * * *